(12) United States Patent
Doris et al.

(10) Patent No.: US 9,184,214 B2
(45) Date of Patent: Nov. 10, 2015

(54) SEMICONDUCTOR DEVICE EXHIBITING REDUCED PARASITICS AND METHOD FOR MAKING SAME

(75) Inventors: Bruce B. Doris, Brewster, NY (US);
Kangguo Cheng, Guilderland, NY (US);
Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 179 days.

(21) Appl. No.: 13/083,893

(22) Filed: Apr. 11, 2011

(65) Prior Publication Data

US 2012/0256277 A1    Oct. 11, 2012

(51) Int. Cl.
*H01L 21/02* (2006.01)
*H01L 27/24* (2006.01)

(52) U.S. Cl.
CPC ..................................... *H01L 27/24* (2013.01)

(58) Field of Classification Search
None
See application file for complete search history.

(56) References Cited

U.S. PATENT DOCUMENTS

| | | | |
|---|---|---|---|
| 5,017,981 A | 5/1991 | Sunami et al. | |
| 5,106,778 A | 4/1992 | Hollis et al. | |
| 6,069,375 A | 5/2000 | Asai | |
| 6,133,099 A | 10/2000 | Sawada | |
| 6,150,245 A | 11/2000 | Asai | |
| 6,326,251 B1 | 12/2001 | Gardner et al. | |
| 6,504,190 B2 | 1/2003 | Haematsu | |
| 6,524,938 B1 | 2/2003 | Tao et al. | |
| 6,583,437 B2 | 6/2003 | Mizuno et al. | |
| 6,979,871 B2 | 12/2005 | Ahn et al. | |
| 7,041,541 B2 | 5/2006 | Behammer | |
| 7,122,449 B2 | 10/2006 | Langdo et al. | |
| 7,306,996 B2 | 12/2007 | Ku et al. | |
| 2001/0048119 A1 | 12/2001 | Mizuno et al. | |
| 2002/0038894 A1 | 4/2002 | Haematsu | |
| 2003/0003640 A1* | 1/2003 | Lee | 438/199 |
| 2004/0061181 A1* | 4/2004 | Satake | 257/368 |
| 2004/0104443 A1 | 6/2004 | Ahn et al. | |
| 2004/0259324 A1* | 12/2004 | Brask et al. | 438/455 |
| 2005/0045969 A1* | 3/2005 | Lee et al. | 257/410 |
| 2005/0242368 A1 | 11/2005 | Udrea et al. | |
| 2005/0242369 A1 | 11/2005 | Udrea et al. | |
| 2006/0019455 A1* | 1/2006 | Bu et al. | 438/303 |
| 2006/0099752 A1* | 5/2006 | Xiang et al. | 438/197 |
| 2006/0214241 A1* | 9/2006 | Pidin | 257/407 |
| 2006/0267106 A1* | 11/2006 | Chao et al. | 257/382 |
| 2007/0122957 A1 | 5/2007 | Anderson et al. | |
| 2007/0224810 A1* | 9/2007 | Graf | 438/672 |
| 2009/0170319 A1* | 7/2009 | Richter et al. | 438/692 |
| 2010/0078687 A1* | 4/2010 | Zhang et al. | 257/255 |
| 2011/0210384 A1* | 9/2011 | Xia et al. | 257/296 |

OTHER PUBLICATIONS

Feng, J., et al., "Modeling and Analysis of Planar-Gate Electrostatic Capacitance of 1-D FET With Multiple Cylindrical Conducting Channels," IEEE Transactions on Electron Devices, Sep. 2007, vol. 54, No. 9, pp. 2377-2385.

* cited by examiner

*Primary Examiner* — Wael Fahmy
*Assistant Examiner* — Sarah Salerno
(74) *Attorney, Agent, or Firm* — Law Office of Charles W. Peterson, Jr.; Louis J. Percello, Esq.

(57) ABSTRACT

A semiconductor device includes a substrate and a gate stack disposed on the substrate. An upper layer of the gate stack is a metal gate conductor and a lower layer of the gate stack is a gate dielectric. A gate contact is in direct contact with the metal gate conductor.

16 Claims, 17 Drawing Sheets

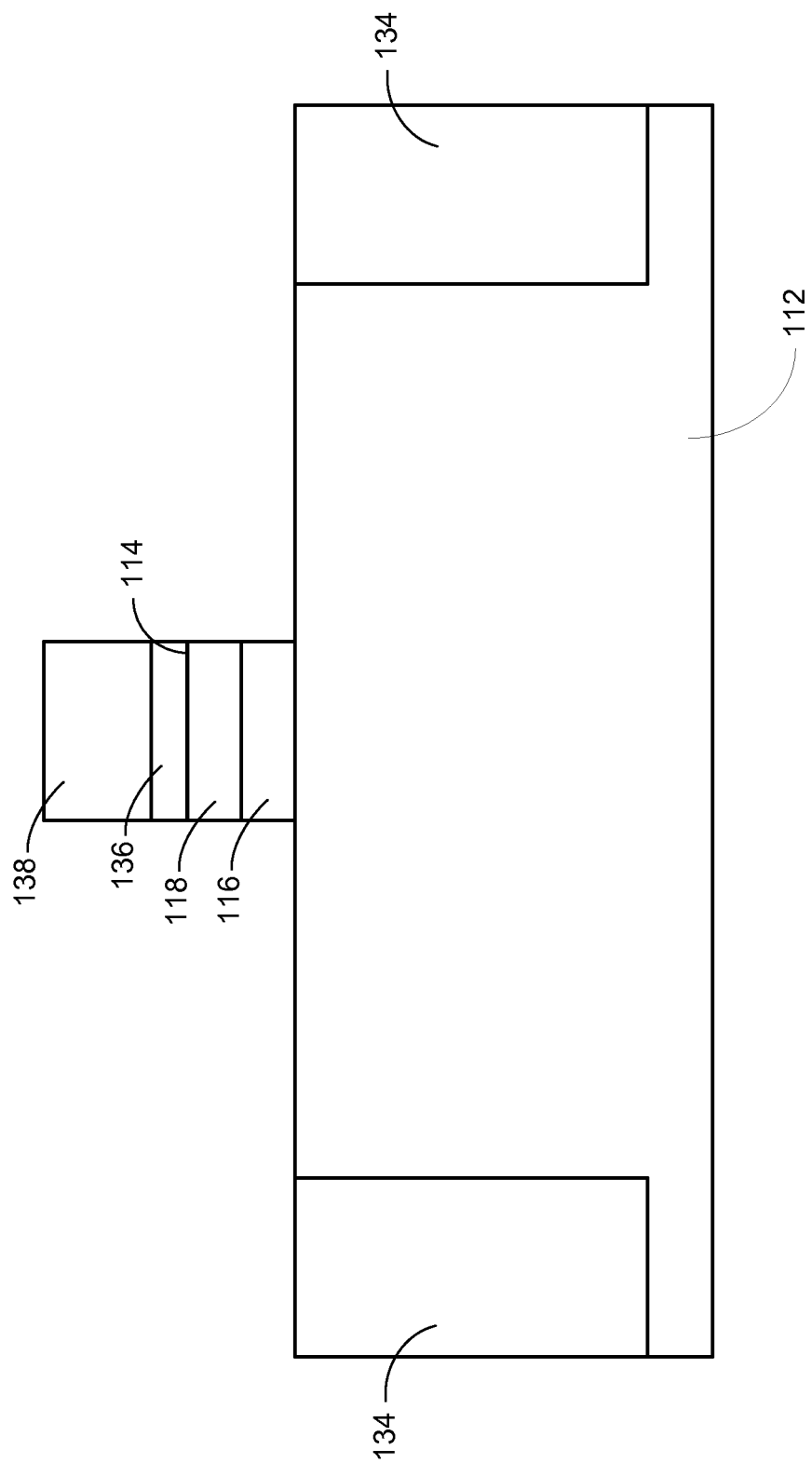

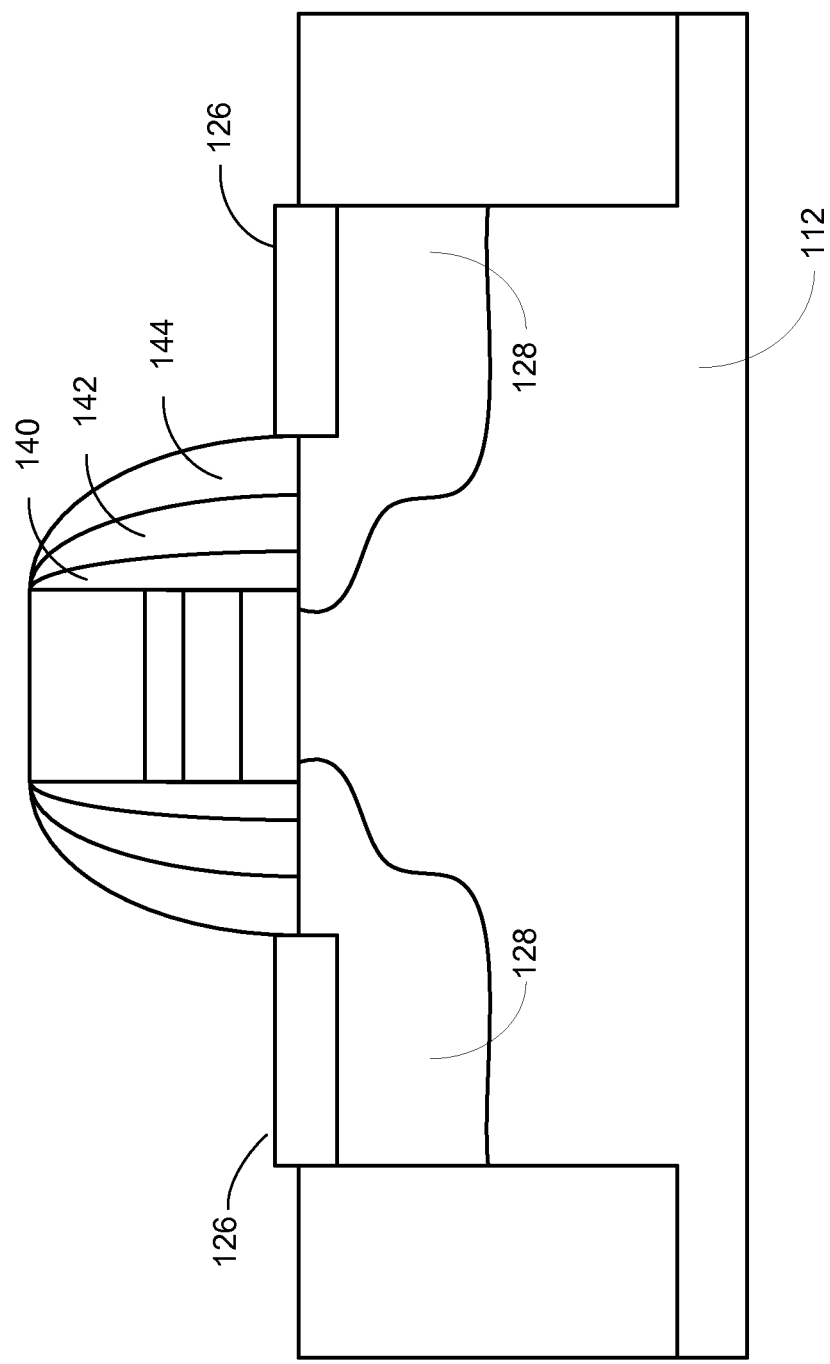

SEMICONDUCTOR DEVICE EXHIBITING REDUCED PARASITICS AND METHOD FOR MAKING SAME

BACKGROUND OF THE INVENTION

1. Field of the Invention

The field of the present invention is semiconductor devices and manufacture methods, particularly for MOSFET semiconductors.

2. Background

One of the major challenges for CMOS scaling is the increased parasitics that the semiconductors exhibit when reduced to smaller and smaller scales. As one example, as the feature sizes of semiconductor devices continue to shrink, the parasitic capacitance between the source/drain contacts and the gate contact increases. The result is a degradation in the overall performance of the scaled down device.

Another challenge introduced with smaller scale devices is found in the increased aspect ration of the source/drain contacts, which causes difficulties in forming the contacts using well-known reactive ion etching (RIE) and fill techniques.

Previously, stress liners have been introduced, and also widely adopted, into semiconductor devices to boost device performance by significantly reducing, if not eliminating, the aforementioned parasitic capacitance. However, the effectiveness of stress liner is reduced by the gate stack, which typically has a relatively tall gate stack.

SUMMARY OF THE INVENTION

The present invention is directed toward a semiconductor device and a method of forming a semiconductor device. The semiconductor device includes a substrate and a gate stack disposed on the substrate. The gate stack has an upper layer as a gate conductor and a lower layer as a gate dielectric, and a gate contact is in direct contact with the gate conductor.

As a further aspect of the semiconductor device, a stress liner may also be placed in direct contact with the gate conductor.

As another further aspect of the semiconductor device, a gate spacer may be included that extends from the substrate about the sides of the gate stack. Formed in this manner, the gate spacer serves to isolate the gate dielectric on the sides of the gate stack. The gate spacer may extend above the upper layer of the gate stack, and a insulator may fill the space between the upper portion of the gate spacer and the gate contact.

A first aspect of the method of forming a semiconductor device includes providing a substrate on which a gate stack is formed, the gate stack having an upper layer as a gate conductor and a lower layer as a gate dielectric. A stress liner is deposited across the substrate and the gate stack, and a gate contact is formed in direct contact with the gate conductor. The stress liner may be deposited so that it is also in direct contact with the gate conductor. Further, prior to depositing the stress liner, a gate spacer may be formed extending from the substrate about the sides of the gate stack, thereby isolating at least the gate dielectric on the sides of the gate stack.

A second aspect of the method of forming a semiconductor device includes providing a substrate, forming a gate spacer on the substrate, then depositing a gate stack on the substrate within the gate spacer. An upper layer of the gate stack is a gate conductor, and a lower layer of the gate stack is a gate dielectric. Lastly, source-drain and gate contacts are formed to electrically connect the source-drain and gate to the metal wiring levels. The upper portion of the gate spacer may extend above the upper layer of the gate stack, and the upper portion of the gate spacer may be filled with an insulator. Initially, the gate spacer may be formed about a dummy gate formed on the substrate, where the dummy gate is removed after the gate spacer is formed, but before the gate stack is formed. The gate stack may be formed first as a gate dielectric layer lining the gate spacer, then as a gate conductor layer, also lining the gate spacer, but on top of the gate dielectric layer. The gate dielectric layer and gate conductor layer are removed from an upper portion of the gate spacer, leaving the gate stack in the lower portion of the gate spacer.

Accordingly, an improved semiconductor device and methods of making a semiconductor device are disclosed. Advantages of the improvements will appear from the drawings and the description of the preferred embodiment.

BRIEF DESCRIPTION OF THE DRAWINGS

In the drawings, wherein like reference numerals refer to similar components:

FIGS. 2A-2G schematically illustrate process steps for forming the semiconductor device of FIG. 1;

DETAILED DESCRIPTION OF THE PREFERRED EMBODIMENTS

Figure 1:
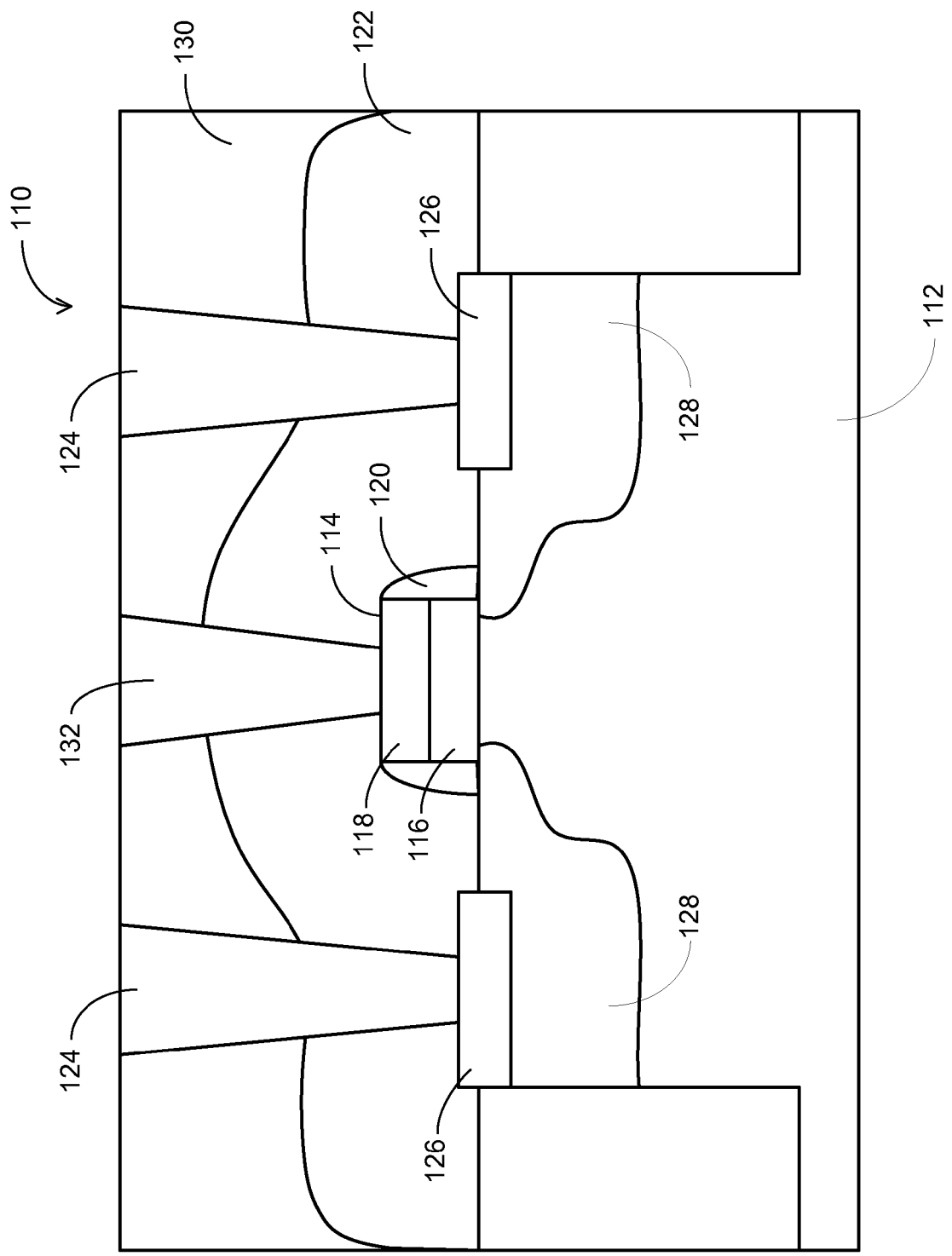
FIG. 1 schematically illustrates a first semiconductor device exhibiting reduced parasitics.

Turning in detail to the drawings, FIG. 1 illustrates a metal oxide semiconductor field effect transistor (MOSFET) 110 formed on a substrate 112. The substrate 112 may be any suitable substrate for semiconductor-device formation, such as a conventional bulk silicon substrate, a silicon-on-insulator-type (SOI) substrate, and the like. The MOSFET 110 is preferably a high-k metal gate MOSFET, and is formed with a relatively low gate stack 114, as shown, in comparison to the MOSFETs known in the prior art. This low gate stack 114 includes a high-k dielectric layer 116 and a metal gate layer 118, and the gate stack 114 is isolated by a thin nitride spacer 120. The MOSFET includes a stress liner 122 overlying the other parts, and source-drain contacts 124 to the silicide regions 126 over the source/drain portions 128 of the substrate 112. Interlevel dielectrics 130, such as are commonly used for field effect transistors, overly the stress liner 122. The gate contact 132 is in direct contact with the metal gate layer 118.

The structure of this MOSFET 110 is anticipated to be advantageous because the gate stack 114, which includes a high-k dielectric layer 116 and a metal gate later 118, has a lower profile as compared to gate stacks of the prior art. The lower gate stack is anticipated to reduce source-drain contact to gate conductor parasitic device capacitance. It is also anticipated to reduce parasitic device capacitance due to variations in depth resulting from reactive ion etching (RIE). The lower gate stack is also anticipated to ease the manufacturing challenges presented by source-drain and gate contact RIE and subsequent fill. The lower gate stack combined with the stress liner being disposed closer to the gate are anticipated to introduce an improved stress effect for the MOSFET 110. In addition, the MOSFET 110 is anticipated to have a lower gate contact resistance due to the direct contact between the CA and the metal gate. Those skilled in the art are likely to identify other advantages provided by this semiconductor device.

Figure 2B:
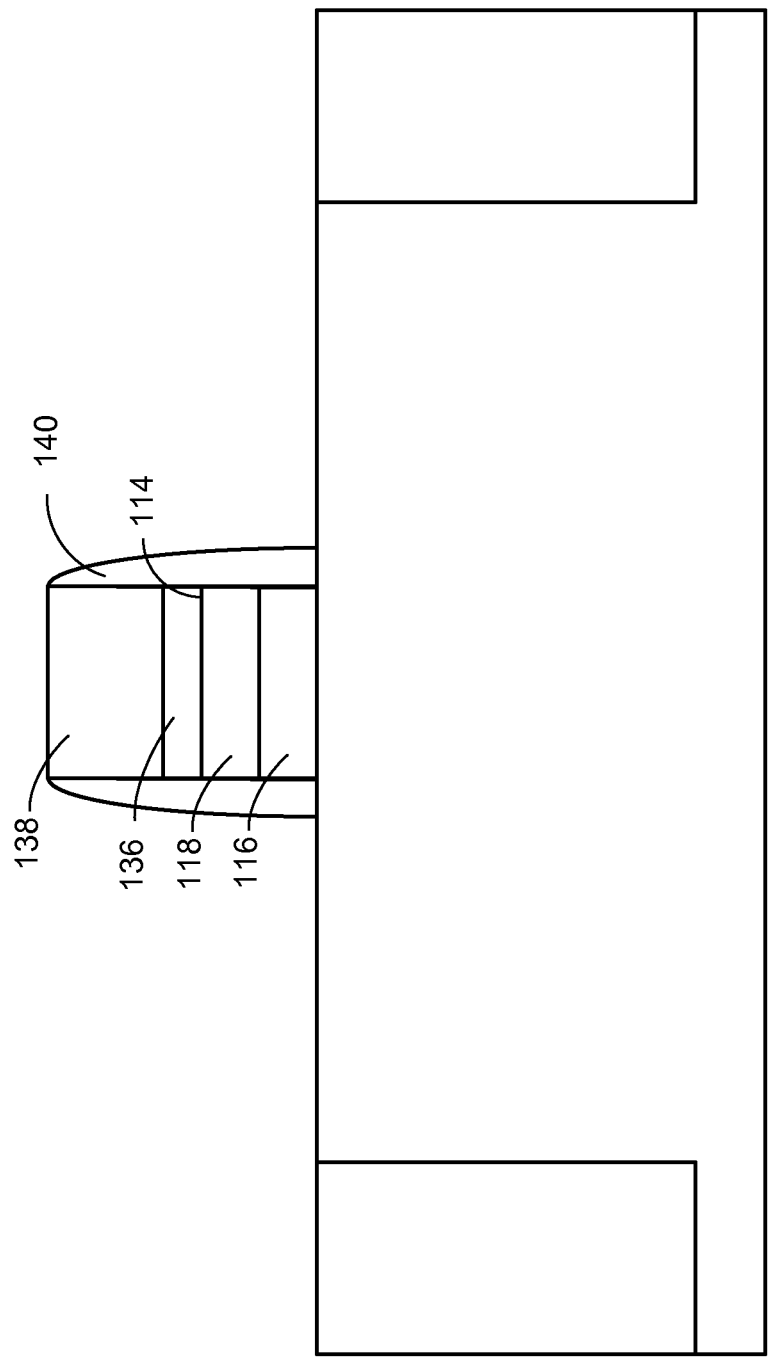

FIGS. 2A-G illustrate a stepwise process for forming the MOSFET 110 shown in FIG. 1. The gate stack 114, which includes the high-k dielectric layer 116 and the metal gate layer 118, is initially formed on the substrate as shown in FIG. 2A. The substrate is prepared in advance to include shallow trench isolation (STI) features 134 on either side of the surface location where the gate stack 114 is formed.

The high-k dielectric layer 116 and the metal gate layer 118 may be formed by any number of processes known to those of skill in the art. For example, the high-k dielectric layer 116 may be deposited by Atomic Layer Deposition (ALD) or Metal Organic Chemical Vapor Deposition (MOCVD) and may be composed of $ZrO_2$, $HfO_2$, HfSiON, and the like. Also by way of example, the metal gate layer 118 may be deposited by Physical Vapor Deposition (PVD), MOCVD or ALD and may be composed of TiN, TaN, W, and the like. The total thickness of the gate stack 114 may be in the range of 3-73 nm, with a preferred thickness of about 5.5 nm. The high-k dielectric layer may form about 1-3 nm of this total thickness, with a preferred thickness of about 2 nm. The thickness of the metal gate layer 118 may be in the range of about 2-70 nm of the total gate stack thickness, with a preferred thickness of about 3.5 nm. In addition, the use of capping layers as is known in the art may be used to adjust the effective work function of the gate stack. In some cases, it may be useful to use one capping layer for one FET type and another for the other FET type. The total thickness of the gate stack 114 may be altered with the use of such capping layers.

A poly layer 136 is formed on top of the gate stack 114, and a cap layer 138, such as a nitride or other similar material, is formed on top of the poly layer 136. The poly layer 136 and the cap layer 138 may be formed by any number of processes known to those of skill in the art. Examples include low pressure chemical vapor deposition (LPCVD), Rapid Thermal Chemical Vapor Deposition (RTCVD), and the like. The thickness of the poly layer 136 may be in the range of 100-1500 A, preferably about 400 A in thickness. The thickness of the cap layer 138 may be in the range of 2 to 70 nm, with a preferred thickness of about 30 nm.

As shown in FIG. 2B, a thin nitride spacer 140 is formed on the side of the gate stack 114, at least up to the thickness of the gate stack 114, plus the poly layer 136 and cap layer 138. The nitride spacer 140 completely seals the edges of the gate stack 114 and serves to protect the gate stack 114 during subsequent processing, as exposure of the high-k dielectric layer 116 in subsequent processing will adversely impact operation of the fully formed MOSFET 110. The nitride spacer 140 may be formed by any number of processes known to those of skill in the art. Examples include depositing a conformal layer of silicon nitride and then using a dry directional etch process to remove the silicon nitride from horizontal surfaces while leaving the silicon nitride film on the vertical portions of the gate stack and cap structures.

At this stage, extension implants or dopant diffusion regions (not shown) may be formed within the substrate. As is well known in the art, extension implants and/or dopant diffusion regions aid in conducting current flow when the transistor is turned on. These extension implants and/or dopant diffusion regions may be formed by any process known to those of skill in the art, and the An oxide spacer 142 is formed about the nitride spacer 140, and an exterior nitride spacer 144 is formed outside the oxide spacer 142. The oxide spacer 142 and the exterior nitride spacer 144 may be formed by any number of processes known to those of skill in the art. Examples include LPCVD and RTCVD, and the like. The thickness of the oxide spacer 142 may be in the range of 1-40 nm, with a preferred thickness of about 5 nm. The thickness of the exterior nitride spacer 144 may be in the range of 1 to 40 nm, and preferably about 10 nm. Both will be removed during later stages of the processing.

Next, the source/drain 128 is formed in the substrate 112, which may be done by any number of processes known to those of skill in the art. One example of such a process is ion implantation. Following formation of the source/drain 128, silicide regions 126 are formed at the surface of the substrate 112. Any suitable form of silicide known to those of skill in the art may be used. Further, the silicide regions 126 may be formed by any number of processes known to those of skill in the art. Examples include NiSi or NiPtSi, and the like. The thickness of the silicide regions 126 may be in the range of 1 to 30 nm, with a preferred thickness of about 18 nm.

Figure 2D:
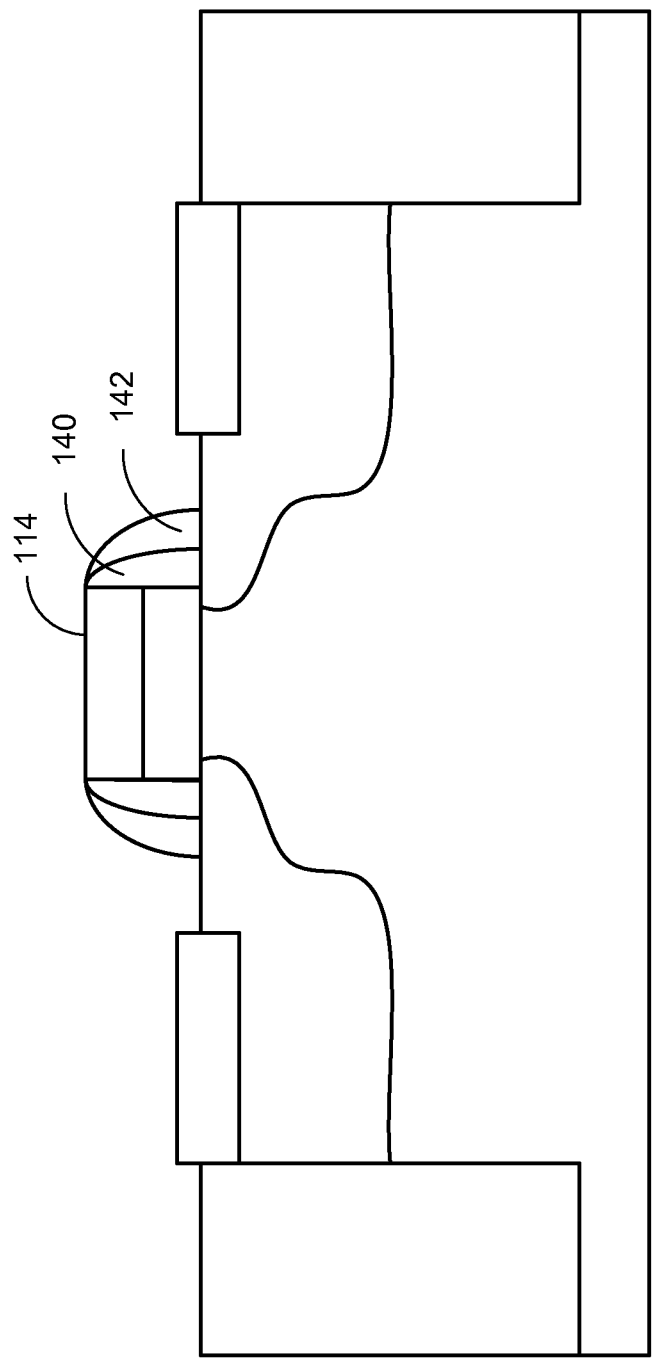

As shown in FIG. 2D, the next processing steps include removing the cap layer, the poly layer, and the exterior nitride spacer. In doing so, the thin nitride spacer 140 and the oxide spacer 142 are reduced to the height of the gate stack 114. Removal of these various layers may be achieved by any number of processes known to those of skill in the art. For example, an etch process that is capable of etching a silicon nitride cap and is also selective to Si and $SiO_2$ can be used to remove the cap layer in the case that the cap material is silicon nitride. Next a dry etch process which is capable of etching poly silicon and is also selective to Si and Si Nitride can be used to remove the poly silicon layer. Alternatively a damascene-like process can be used to remove the cap and poly silicon layer.

Figure 2E:
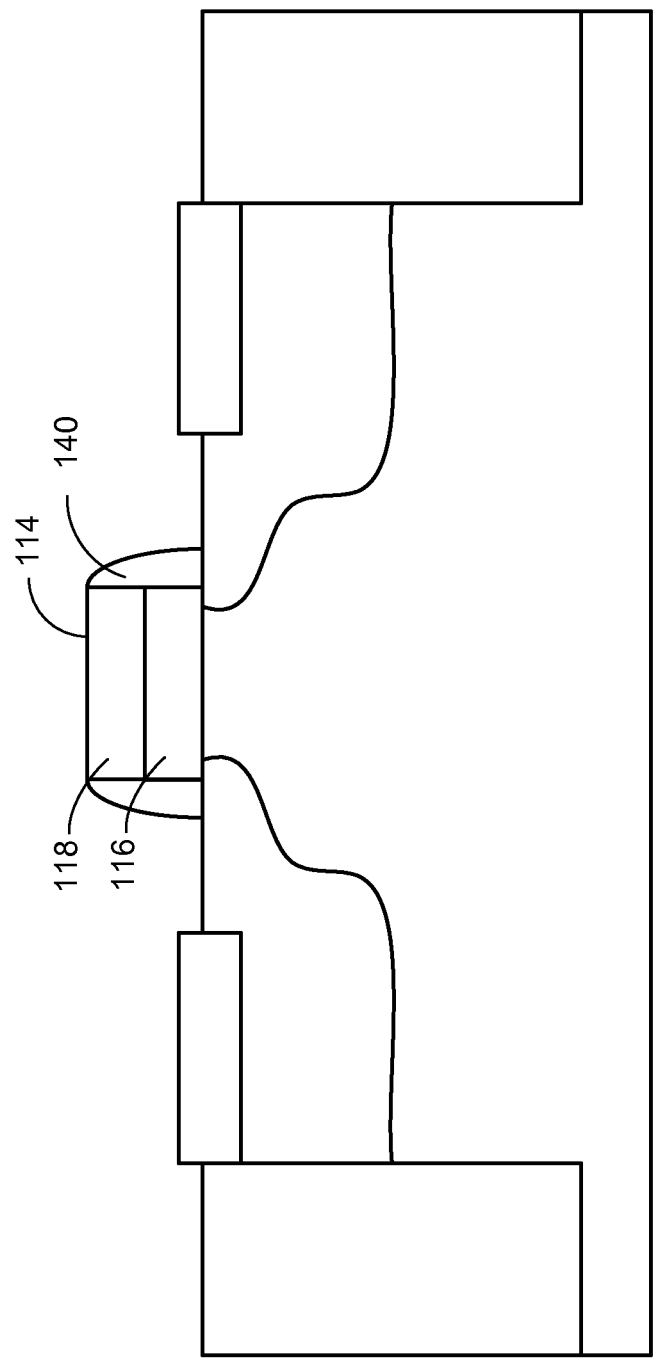

The oxide spacer is next removed, leaving the high-k dielectric layer 116 completely protected by the thin nitride spacer 140, as shown in FIG. 2E. Removal of the oxide spacer may be achieved by any number of processes known to those of skill in the art. Examples include dilute hydrofluoric acid, oxide RIE, and the like.

Figure 2F:
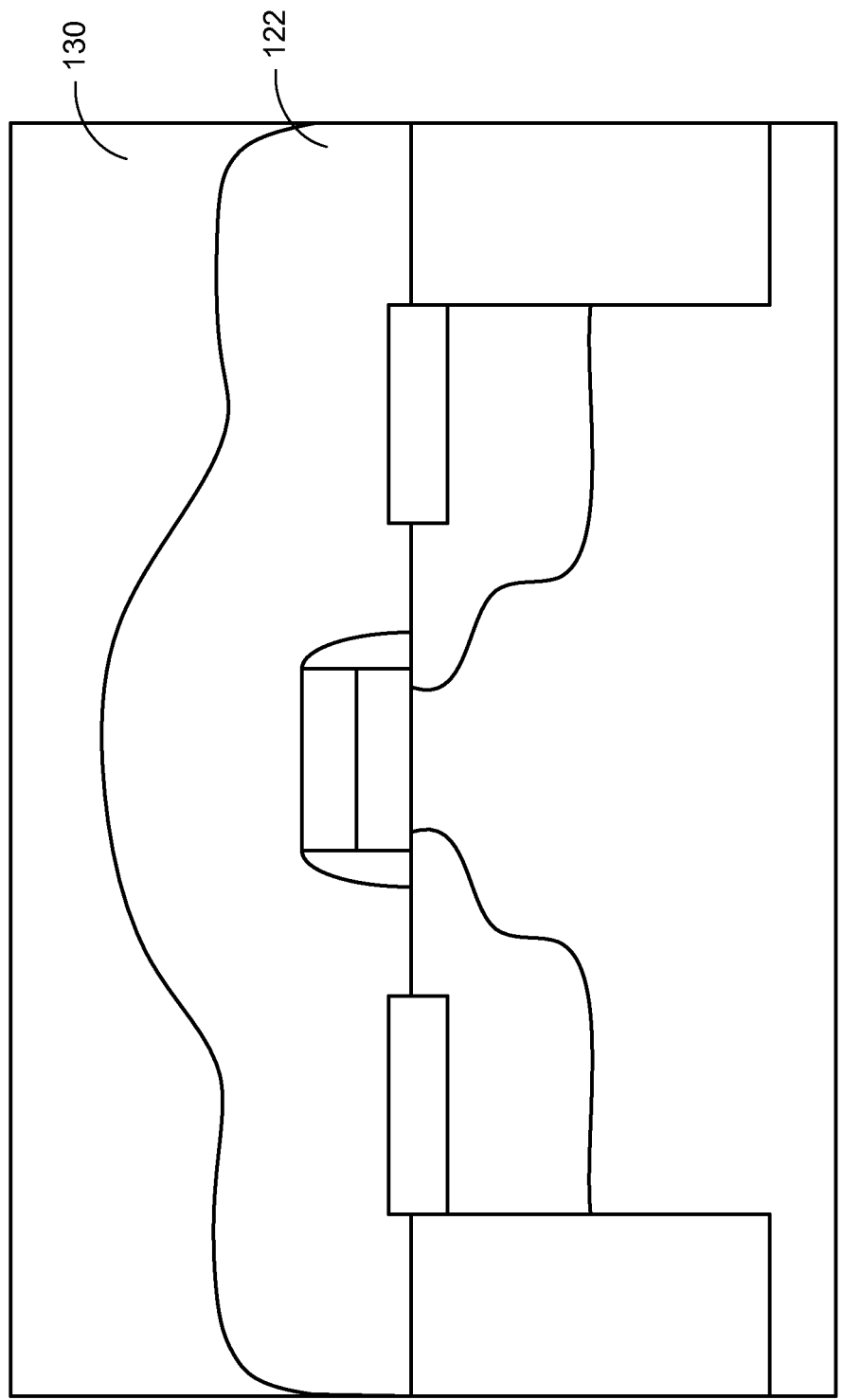

As shown in FIG. 2F, the stress liner 122 is next deposited, followed by the pre-metal dielectric 130. The stress liner may be a nitride or other similar material, and by being deposited at this stage of the process, it is closer to the gate as compared to stress liners known within the prior art, thereby providing at least the above-mentioned anticipated advantages. The pre-metal dielectric may be any appropriate type of such material know to those of skill in the art. Both the stress liner 122 and the pre-metal dielectric 130 may be deposited by any number of processes known to those of skill in the art. Examples include High Density Plasma Deposition (HDP), Sub Atmospheric Vapor Deposition (SACVD), and the like.

Figure 2G:
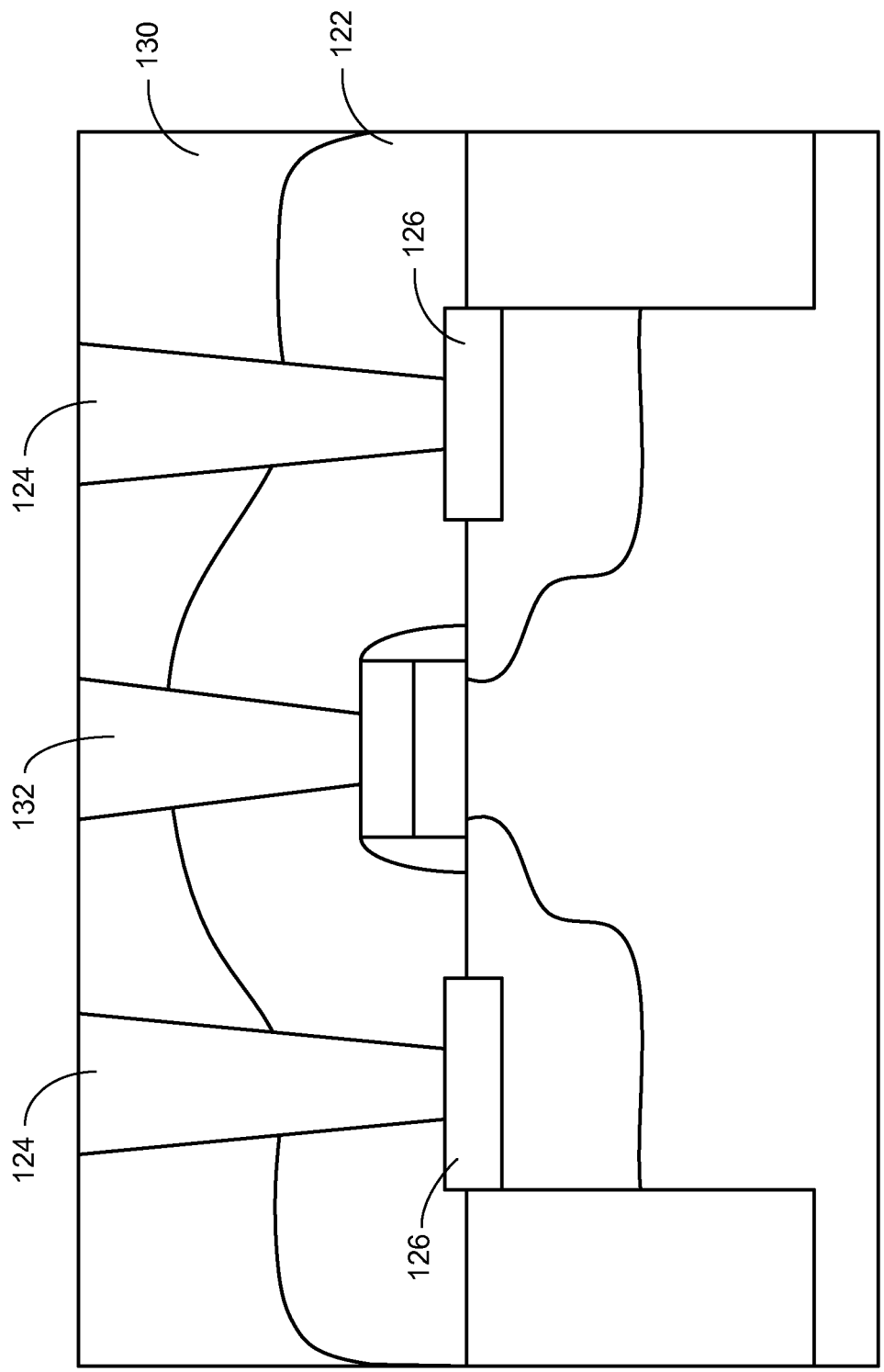

FIG. 2G shows the final step in the processing, which is the formation of the contacts 124, 132 through the pre-metal dielectric 130 and the stress liner 122. The two source-drain contacts 124 are placed in direct contact with each of the two silicide regions 126, while the gate contact 132 is placed into direct contact with the metal gate layer 118. The contacts 124, 132 may be formed by any number of processes known to those of skill in the art. Examples include lithography to define the contact images and dry etching to remove the oxide and stressed nitride layers not covered by the resist. For example, a liner such as TiN may deposited onto the wafer, with a material such as tungsten (W) being next deposited, after which a chemical mechanical polishing process may be used to remove the W and TiN liner from the horizontal surfaces, leaving the liner and the metal in the contact hole.

Figure 3:
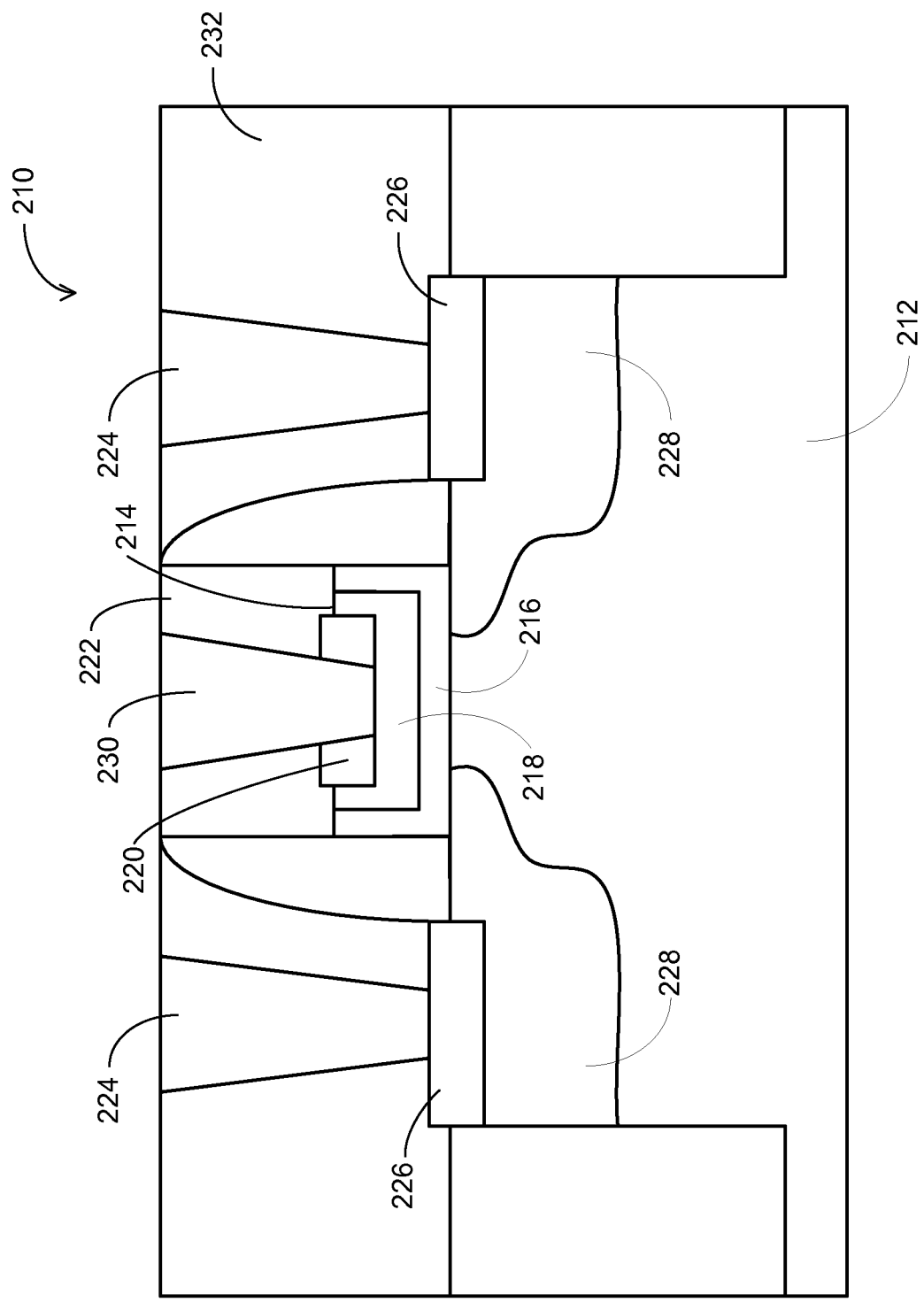
FIG. 3 schematically illustrates a second semiconductor device exhibiting reduced parasitics.

FIG. 3 illustrates a second MOSFET 210 formed on a substrate 212. This MOSFET 210 is anticipated to exhibit some of the same advantages described above due to the lower gate stack and direct contact between the gate contact and the metal gate layer.

Again, the substrate 212 may be any suitable substrate for semiconductor-device formation, such as a conventional bulk silicon substrate, a silicon-on-insulator-type (SOI) substrate, and the like. The MOSFET 210 is also preferably a high-k metal gate MOSFET, and is also formed with a gate stack 214 of relatively short height, as shown, in comparison to the MOSFETs known in the prior art. This gate stack 214 includes a high-k dielectric layer 216 and a metal gate layer 218, and the gate stack 214 is isolated by a combination of a nitride spacer 220 and an oxide fill 222. Source-drain contacts 224 extend to the silicide regions 226 over the source/drain portions 228 of the substrate 212. The gate contact 230 is in direct contact with the metal gate layer 218. The MOSFET includes a pre-metal dielectric oxide layer 232 overlying the other parts as shown.

Figure 4A:
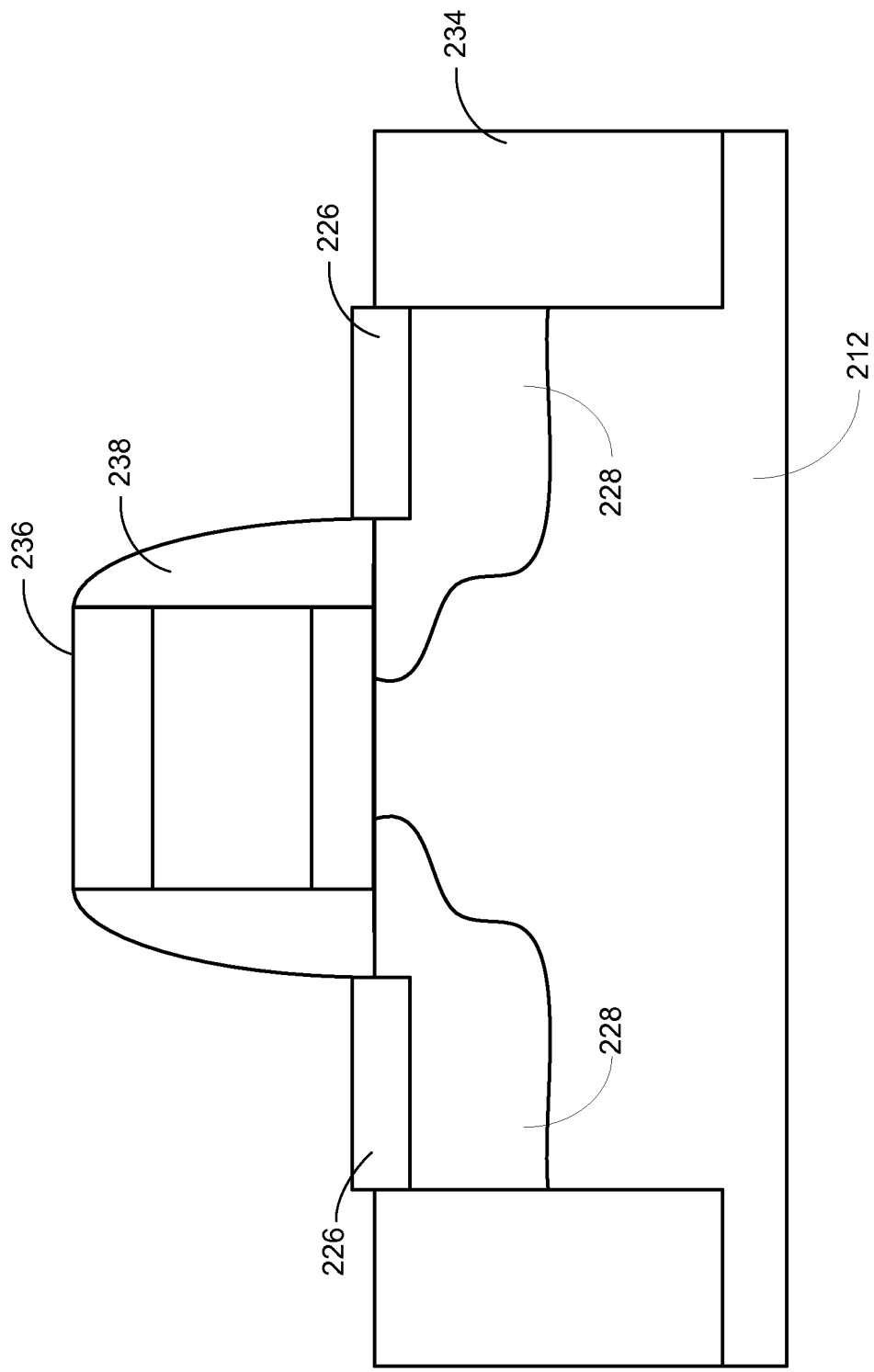
FIGS. 4A-4H schematically illustrate process steps for forming the semiconductor device of FIG. 3.

FIGS. 4A-H illustrate a stepwise process for forming the MOSFET 210 shown in FIG. 3. As shown in FIG. 4A, initially, the substrate 212 and structure formed on the substrate are prepared. These include the shallow trench isolation (STI) features 234 and the source/drain regions 228 formed on either side of the surface location where the gate stack will be formed. The silicide regions 226 are formed at the surface of the substrate 212 above the source/drain regions 228, and a dummy gate stack 236 is formed with a gate spacer 238 formed extending from the substrate 212 about the sides of the dummy gate stack 236, thereby effectively isolating the sides of the dummy gate stack 236. As shown, the dummy gate stack includes a bottom oxide layer, a middle poly layer, and an upper nitride layer, although the dummy gate structure may have any desirable structure. These features and structures may be formed by any number of processes known to those of skill in the art, and they may have any desired thicknesses or dimensions based upon chosen design specifications.

Figure 4B:
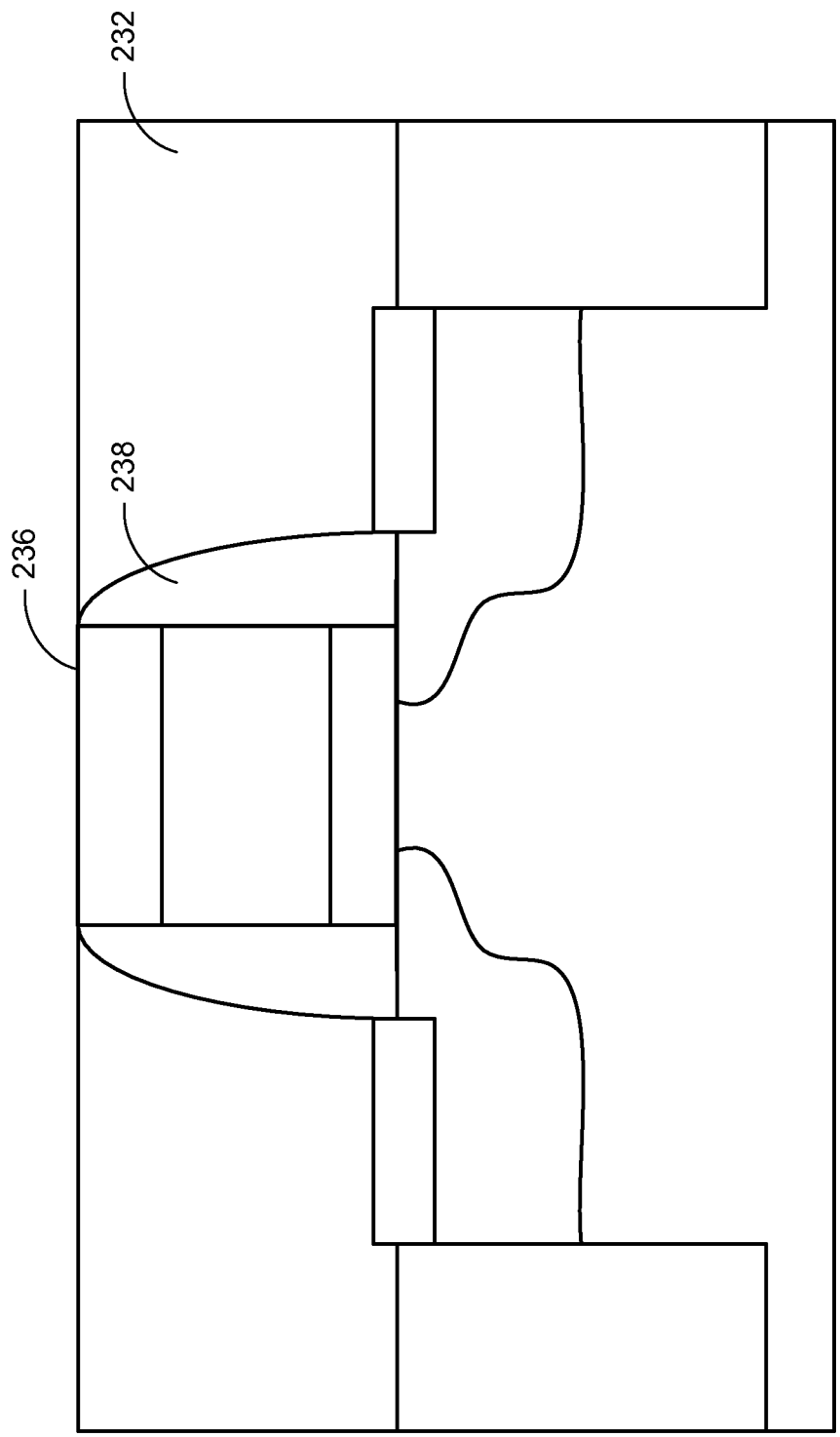

Once these initial structure and features are in place, as shown in FIG. 4B, the pre-metal dielectric 232 is deposited as a protective layer over all features, leaving the dummy gate stack 236 exposed. Preferably, the pre-metal dielectric 232 forms a planar surface at the height of the dummy gate stack 236 and spacer 238. The pre-metal dielectric 232 may be deposited by any number of processes known to those of skill in the art.

Figure 4C:
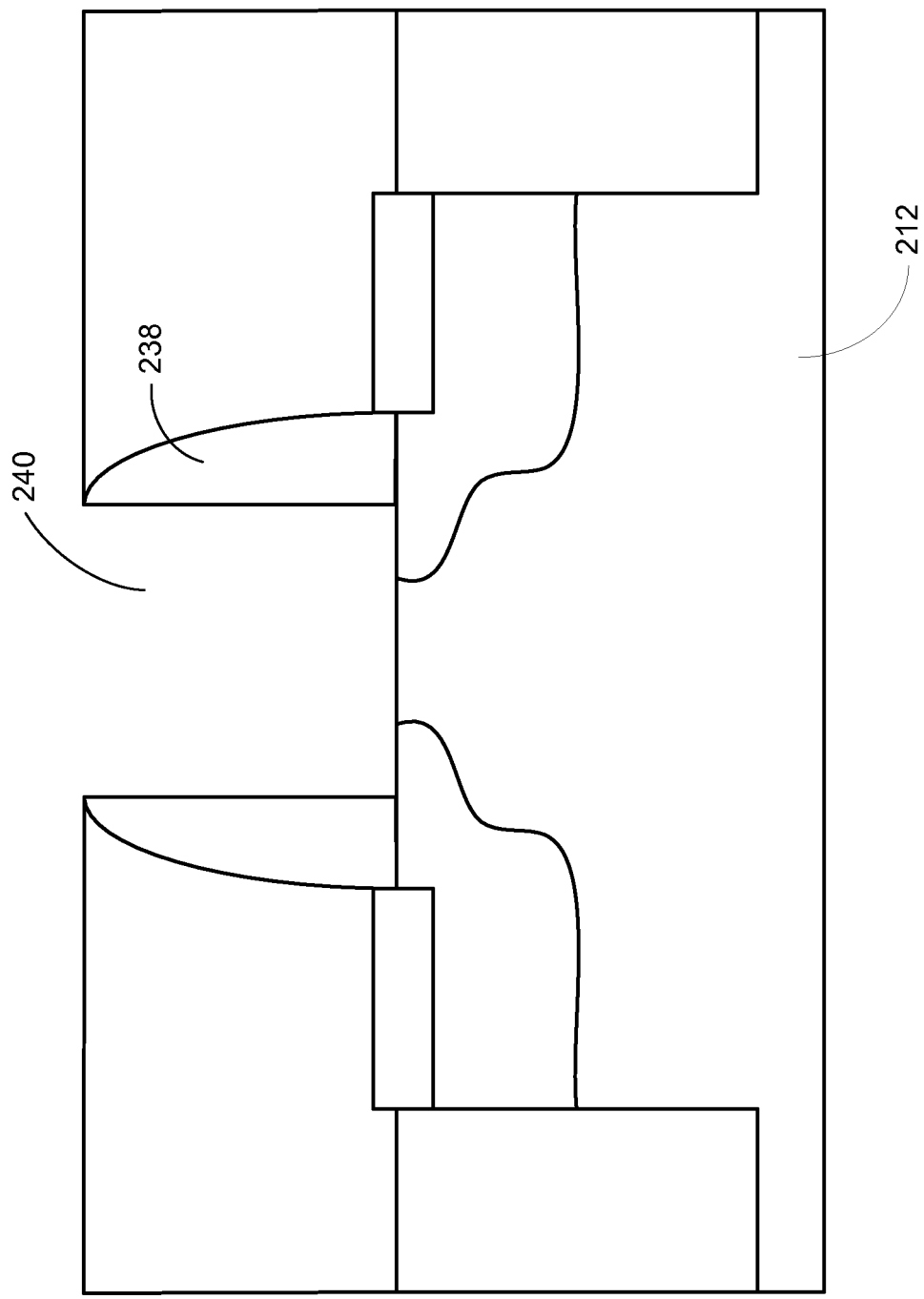

Next, the dummy gate stack is removed, leaving all other structures and features remaining on the substrate 212 and a gate gap 240 between the spacers 238, as shown in FIG. 4C. Removal of the dummy gate stack may by accomplished by any number of processes known to those of skill in the art.

Figure 4D:
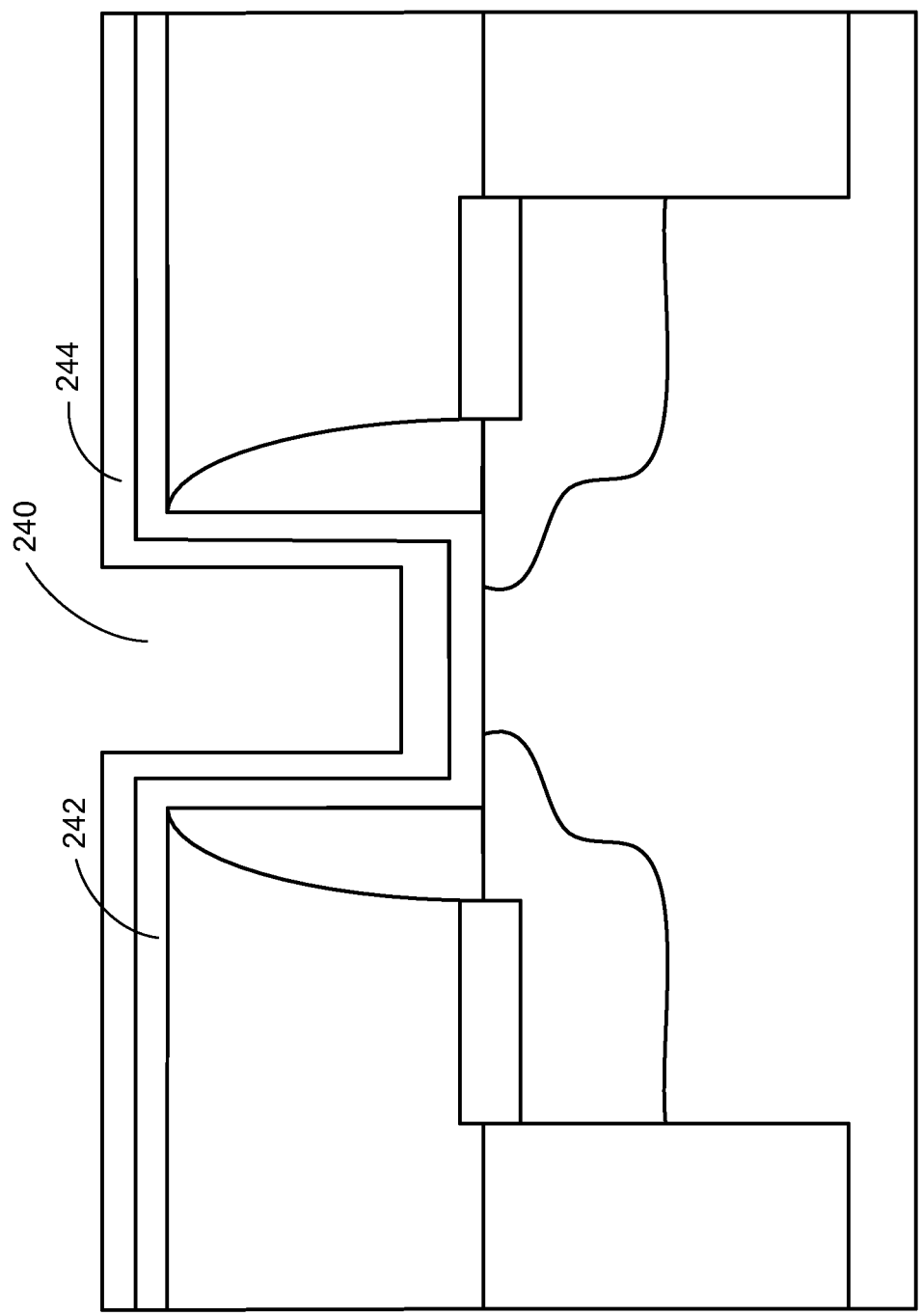

With the dummy gate structure removed, a high-k dielectric layer 242 is deposited across the entire structure, followed by deposition of a metal layer 244, as shown in FIG. 4D, including within the gate gap 240. Portions of these two layers, when the process is complete, will form the gate stack within the gate gap 240. The high-k dielectric layer 242 and the metal layer 244 may be formed by any number of processes known to those of skill in the art. One preferred example is Atomic Layer Deposition. The combined thickness of these two layers may be in the range of 3-70 nm, with a preferred thickness of about 25 nm. Preferably, the high-k dielectric layer 242 forms about 1-2 nm of this total thickness.

Figure 4E:
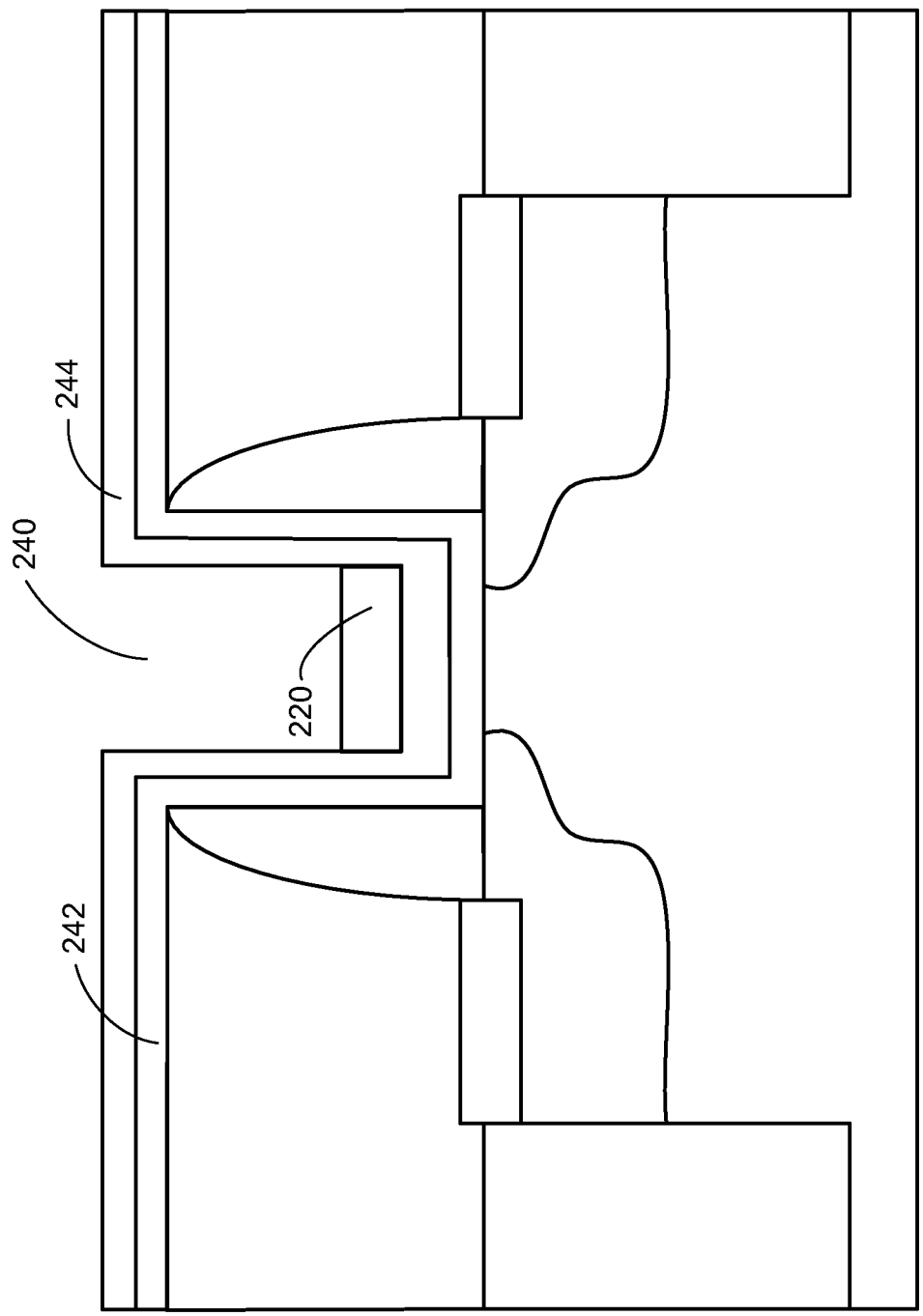

The oxide layer 220, is next is formed within the gate gap 240, as shown in FIG. 4E. This oxide layer 220 covers the lower portions of the high-k dielectric layer 242 and the metal layer 244 within the gate gap 240, while leaving the rest of these two layers exposed for further processing. The oxide layer 220 may be formed by any number of processes known to those of skill in the art. Examples include HDP, SACVD, formation by a spin on or flowable oxide, and the like. The thickness of the oxide layer 220 may be in the range of 20-200 nm, with a preferred range of about 70 nm. After the oxide deposition, a short chemical-mechanical planarization (CMP) process may be used to planarize the oxide, with a dry etch process next used to recess the oxide, thereby leaving the oxide in the bottom of the gate hole.

Figure 4F:
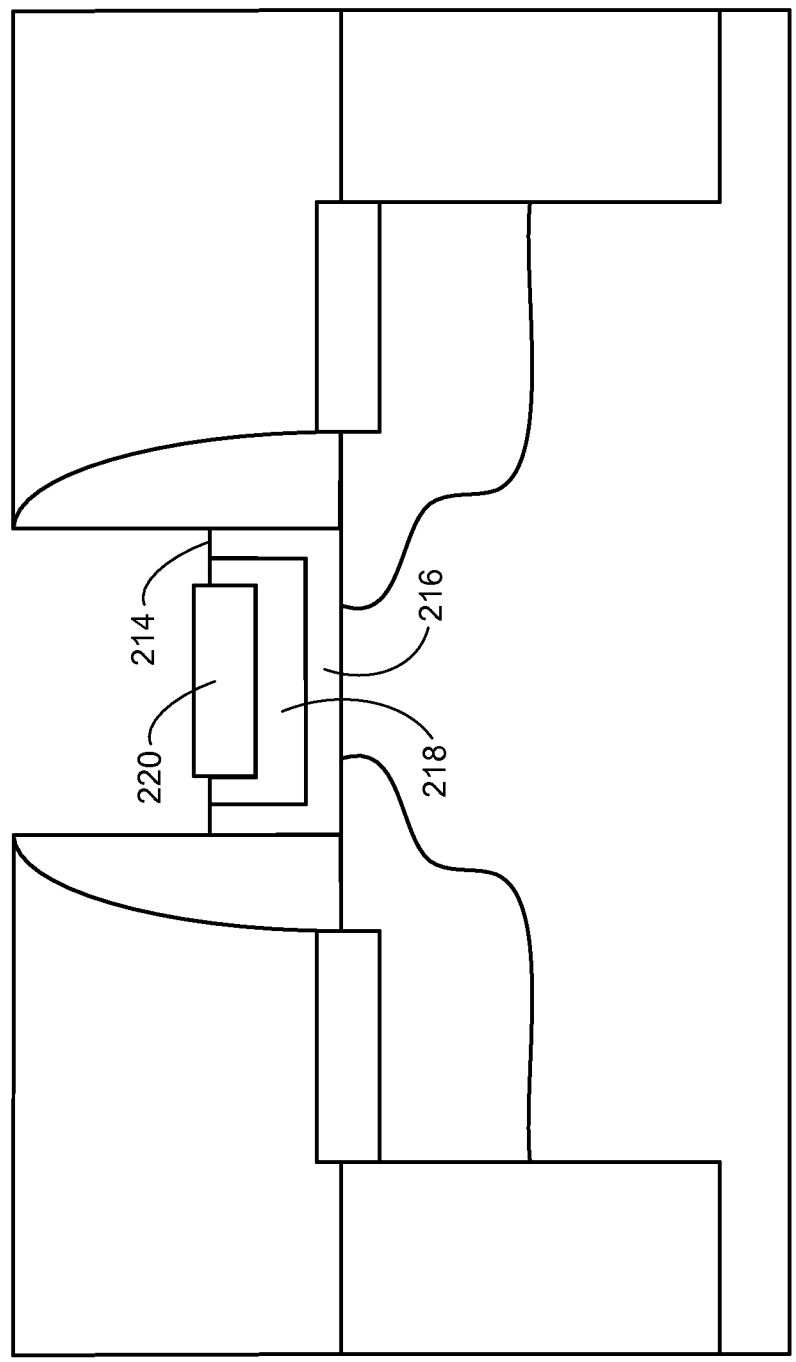

Next, the exposed portions of the high-k dielectric layer and the metal layer are removed, as shown in FIG. 4F. Removal may be accomplished by any number of processes known to those of skill in the art. Examples include an RIE process like HBr and BCL3 to remove the metal and high k dielectric layers selectively compared to the oxide layers. The remaining portions of the high-k dielectric layer and the metal layer form the high-k dielectric layer 216 and the metal gate layer 218 of the gate stack 214. Because the gate stack 214 does not extend up the entire sidewall of the spacer 238, the MOSFET resulting from the finished process is anticipated to have a lowered parasitic capacitance.

Figure 4G:
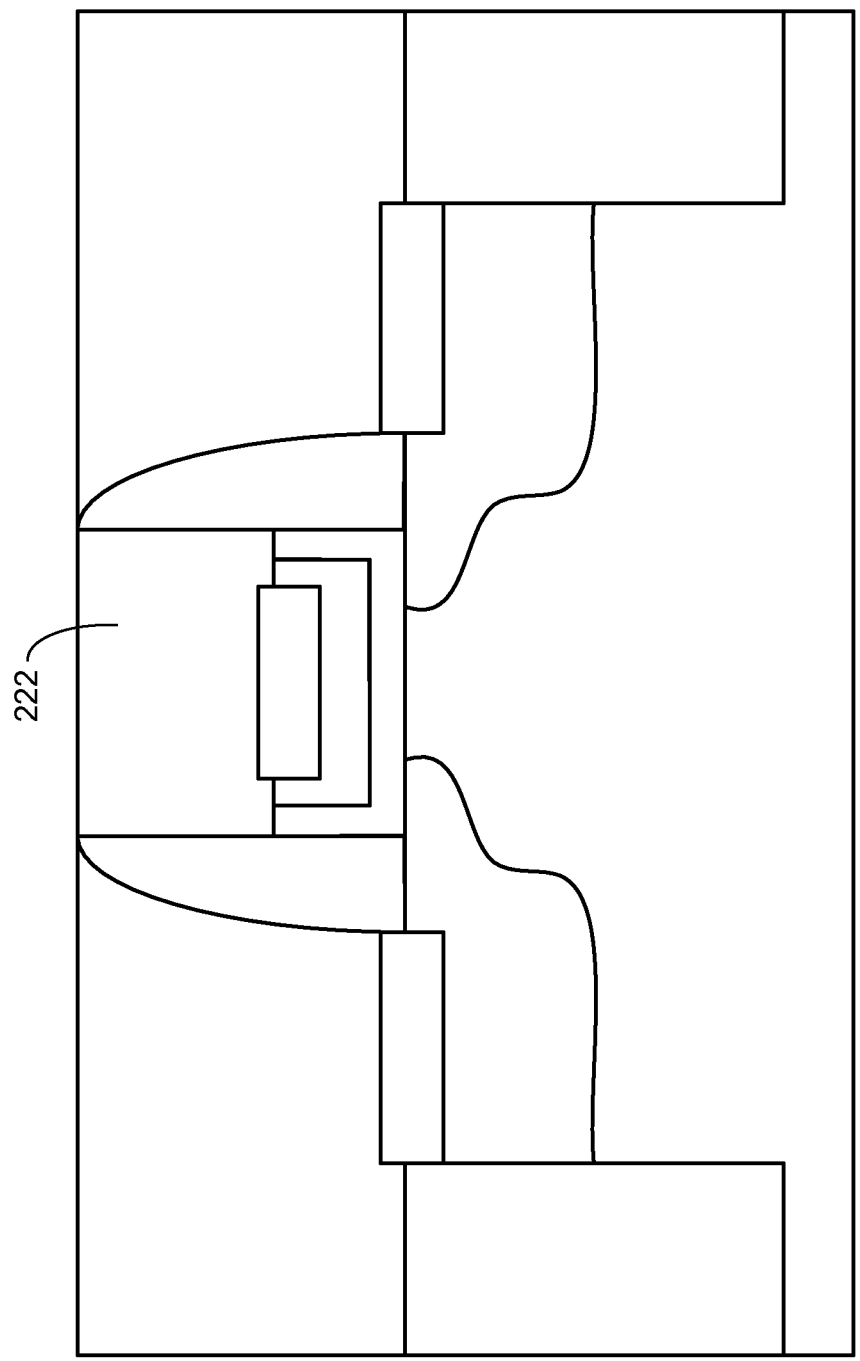

The open area of the gate gap 240 is then filled with the insulator 222, such as an oxide or a nitride, as shown in FIG. 4G. The insulator 222 may be formed by any number of processes known to those of skill in the art. Examples include silicon nitride or silicon dioxide deposited by rapid thermal chemical vapor deposition (rpcvd), and the like.

Figure 4H:
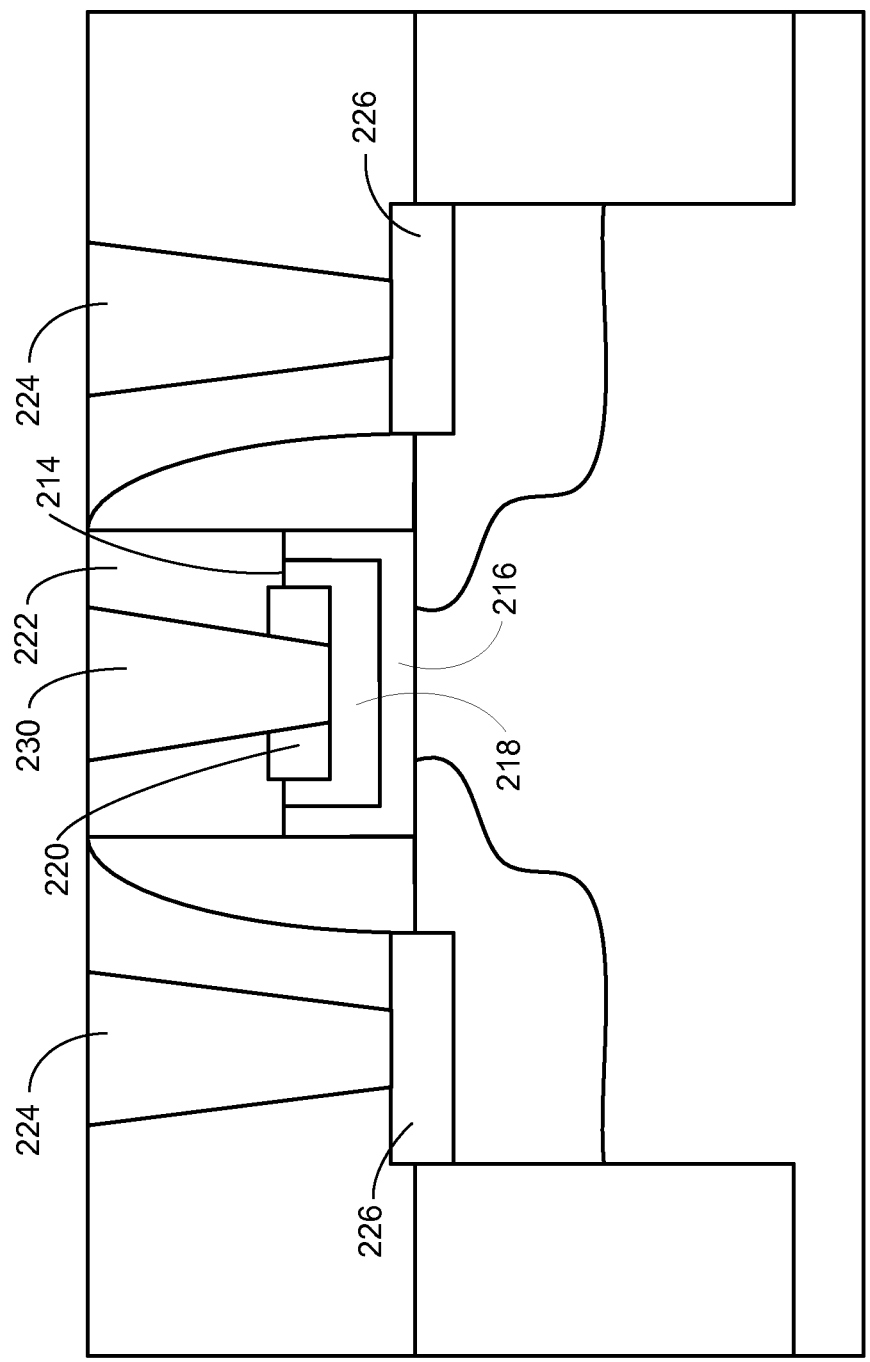

FIG. 4H shows the final step in the processing, which is the formation of the contacts 224, 230. The gate contact 230 extends through the insulator 222 and the oxide layer 220 to come into direct contact with the metal gate layer 218. The source/drain contacts 224 are placed in direct contact with each of the two silicide regions 226. The contacts may be formed by any number of processes known to those of skill in the art, such as those stated above.

Thus, a semiconductor device and methods of making a semiconductor device are disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. A semiconductor device comprising:
   a substrate;
   a gate stack disposed above a device channel on the substrate, the gate stack comprising a metal gate conductor on a gate dielectric disposed on said device channel, wherein the thickness of the gate stack is in the range of 3-73 nm;
   a gate spacer extending from the surface of said substrate about the sides of the gate stack, the thickness of said gate spacer being as thick as said gate stack;
   a stress liner comprising a nitride layer on said substrate and overlaying the metal gate conductor and extending from said substrate between the gate spacers;
   a dielectric layer atop the stress liner;
   a gate contact above said device channel through said dielectric layer and said stress liner and in direct contact with the metal gate conductor, said gate contact being narrower than the length of the metal gate conductor and at least 3 times as tall as said gate stack;
   a source and drain region adjacent said gate spacer at each end of said gate stack;
   a silicide region on each of the source and drain regions, said stress liner separating each said silicide region at said substrate from a respective said gate spacer; and a source/drain contact through said dielectric layer and said stress liner and on an upper surface of each respective said silicide region, the source/drain contacts being at least 3 times as tall as said gate stack.

2. The device of claim 1, wherein the gate dielectric comprises a high-k dielectric.

3. The device of claim 2, wherein the thickness of the high-k dielectric layer is about 1-3 nm.

4. The device of claim 3, wherein the thickness of the high-k dielectric layer is about 2 nm.

5. The device of claim 4, wherein the thickness of the metal gate conductor is about 3.5 nm.

6. The device of claim 1, wherein an insulator fills the space between the upper portion of the gate spacer and the gate contact.

7. The device of claim 1, wherein the gate spacer comprises a nitride.

8. The device of claim 1, wherein the metal gate conductor is TiN, TaN, or W.

9. The device of claim 1, wherein said stress liner separates each said silicide region at said substrate from a respective said gate spacer by 2-40 nm.

10. A semiconductor device comprising:
   a substrate;
   a gate stack disposed above a device channel on the substrate, the gate stack being a metal gate conductor on a high-k gate dielectric disposed on said device channel, wherein a thickness of the gate stack is between is in the range of 3-73 nm;
   a nitride gate spacer extending from the substrate about sides of the gate stack and having a 3-73 nm thickness;
   a stress liner comprising a nitride layer on said substrate and overlaying the metal gate conductor and extending from said substrate between the gate spacers;
   a pre-metal dielectric layer atop the stress liner;
   a gate contact above said device channel through said pre-metal dielectric layer and said stress liner and in direct contact with the metal gate conductor, said gate contact being narrower than the length of the metal gate conductor and at least 3 times as tall as said gate stack;
   a source and drain region adjacent said gate spacer at each end of said gate stack;
   a silicide region on each of the source and drain regions, said stress liner separating each said silicide region at said substrate from a respective said gate spacer by 2-40 nm, and wherein the thickness of the high-k dielectric layer is about 1-3 nm and the thickness of the metal gate conductor is about 2-70 nm; and
   a source/drain contact through said pre-metal dielectric layer and said stress liner to a respective silicide region, the source/drain contacts being at least 3 times as tall as said gate stack.

11. The semiconductor device of claim 10, wherein the metal gate conductor is TiN, TaN, or W.

12. The semiconductor device of claim 10, wherein said stress liner separates each said silicide region at said substrate from a respective said gate spacer by 2-40 nm.

13. A field effect transistor (FET) comprising:
   an FET gate disposed on a surface of a semiconductor body and defining a channel in the semiconductor surface, said FET gate including a metal gate on a gate dielectric, wherein the gate and gate dielectric have a first thickness;
   a source/drain region in said surface on each side of said FET gate;
   a gate sidewall spacer extending upward from said surface along each side of said FET gate, the thickness of said gate sidewall spacer being said first thickness;
   a silicide region on each said source/drain region at said surface, gate sidewall spacers being between said metal gate and adjacent source/drain silicide regions;
   a nitride stress liner layer on said semiconductor body, said nitride stress liner layer separating each said gate sidewall at said semiconductor surface from a respective adjacent source/drain silicide region;
   a dielectric layer on said nitride stress liner layer;
   a gate contact through said nitride stress liner layer and said dielectric layer to said metal gate, said gate contact being narrower than the length of the metal gate and at least 3 times as tall as said FET gate; and
   a source/drain contact through said nitride stress liner layer and said dielectric layer to an upper surface of each said source/drain silicide region, the source/drain contacts being at least 3 times as tall as said FET gate.

14. The FET of claim 13, wherein the semiconductor body is a bulk silicon substrate.

15. The FET of claim 13, wherein the semiconductor body is a silicon-on-insulator-type (SOI) substrate.

16. The FET of claim 13, wherein said first thickness is 2-73 nm and said nitride stress liner separates each said silicide region at said surface from a respective said gate spacer by 2-40 nm.

* * * * *